(12) United States Patent
Du

(10) Patent No.: US 9,959,829 B2
(45) Date of Patent: May 1, 2018

(54) LIQUID CRYSTAL DRIVE CIRCUIT AND GOA PANEL WITH SHARED AUXILIARY PULL-DOWN CIRCUIT

(71) Applicant: SHENZHEN CHINA STAR OPTOELECTRONICS TECHNOLOGY CO., LTD., Shenzhen, Guangdong (CN)

(72) Inventor: Peng Du, Guangdong (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 162 days.

(21) Appl. No.: 14/905,764

(22) PCT Filed: Dec. 30, 2015

(86) PCT No.: PCT/CN2015/099703
§ 371 (c)(1),
(2) Date: Jan. 15, 2016

(87) PCT Pub. No.: WO2017/088267
PCT Pub. Date: Jun. 1, 2017

(65) Prior Publication Data
US 2017/0229082 A1    Aug. 10, 2017

(30) Foreign Application Priority Data
Nov. 24, 2015    (CN) ........................... 2015 1 0821594

(51) Int. Cl.
*G09G 3/36*    (2006.01)

(52) U.S. Cl.
CPC ......... *G09G 3/3677* (2013.01); *G09G 3/3696* (2013.01); *G09G 2300/0809* (2013.01)

(58) Field of Classification Search
CPC ............... G09G 3/3677; G09G 3/3696; G09G 2300/0809
See application file for complete search history.

(56) References Cited

U.S. PATENT DOCUMENTS

| | | | | | |
|---|---|---|---|---|---|
| 2002/0149318 | A1* | 10/2002 | Jeon | ..................... | G09G 3/3648 315/169.1 |
| 2005/0201508 | A1* | 9/2005 | Shin | ..................... | G09G 3/3677 377/10 |

(Continued)

FOREIGN PATENT DOCUMENTS

| CN | 101661798 A | 3/2010 |
|---|---|---|
| CN | 102945660 A | 2/2013 |

(Continued)

*Primary Examiner* — Ryan A Lubit
(74) *Attorney, Agent, or Firm* — Kirton McConkie; Evan R. Witt

(57) ABSTRACT

The present invention relates to a liquid crystal drive display device, including a display area and a liquid crystal drive circuit, the liquid crystal drive circuit including a plurality of stage GOA circuits, each stage GOA circuit includes a signal line and an auxiliary pull-down circuit, wherein the signal lines are divided into odd-numbered signal lines and even-numbered signal lines, the auxiliary pull-down circuits are divided into first auxiliary pull-down circuits and second auxiliary pull-down circuits; wherein the odd-numbered signal lines and the even-numbered signal lines are separately located on two sides of the display area, and the first auxiliary pull-down circuits and the second auxiliary pull-down circuits are also separately located on two sides of the display area, any two adjacent stage GOA circuits of the plurality of stage GOA circuits share the first auxiliary pull-down circuits and the second auxiliary pull-down circuits.

11 Claims, 3 Drawing Sheets

(56) References Cited

U.S. PATENT DOCUMENTS

| | | | |
|---|---|---|---|
| 2007/0183218 A1* | 8/2007 | Lee | G09G 3/3677 365/185.26 |
| 2008/0266477 A1* | 10/2008 | Lee | G09G 3/3677 349/46 |
| 2009/0040203 A1* | 2/2009 | Kim | G09G 3/3677 345/204 |
| 2010/0238143 A1 | 9/2010 | Liu | |
| 2011/0002438 A1* | 1/2011 | Kim | G11C 19/28 377/67 |
| 2011/0141074 A1 | 6/2011 | Koo | |
| 2014/0092082 A1* | 4/2014 | Choi | G09G 3/3696 345/213 |
| 2014/0240209 A1* | 8/2014 | Zhang | G09G 3/3648 345/92 |
| 2015/0221272 A1* | 8/2015 | Xu | G09G 3/36 345/211 |
| 2015/0302813 A1 | 10/2015 | Yu | |
| 2016/0253938 A1 | 9/2016 | Yu et al. | |

FOREIGN PATENT DOCUMENTS

| | | |
|---|---|---|
| CN | 103680386 A | 3/2014 |
| CN | 103730093 A | 4/2014 |
| CN | 103744206 A | 4/2014 |
| CN | 103928001 A | 7/2014 |
| CN | 103956146 A | 7/2014 |
| CN | 104505046 A | 4/2015 |
| CN | 104882107 A | 9/2015 |

* cited by examiner

LIQUID CRYSTAL DRIVE CIRCUIT AND GOA PANEL WITH SHARED AUXILIARY PULL-DOWN CIRCUIT

BACKGROUND OF THE INVENTION

1. Field of the Invention

The invention relates to liquid crystal drive display technology, and particularly to a liquid crystal drive circuit and a GOA (Gate Driver on Array) panel.

2. Description of the Related Art

GOA (Gate Driver on Array) technology directly manufactures a gate drive circuit on an array substrate and around a panel to reduce the manufacture process and product cost. With the growing popularity of the narrow border design, surrounding space around the panel design is gradually smaller; in a traditional design of a GOA circuit, a height of a wiring space and a size of a corresponding pixel of each stage a GOA circuit are the same. Products with 4K or higher ppi resolution are currently more popular. The size of the pixel is getting smaller, the height of wiring space for the GOA circuit is thus getting smaller. Because the height is limited, only wider width can compensate when wiring, this is very unfavorable to the narrow border design.

The traditional GOA circuit consists of basic circuits and auxiliary pull-down circuits, typically the set of auxiliary pull-down circuits are constituted by two auxiliary pull-down circuits, each auxiliary pull-down circuit performs the pull-down operation during different periods of time, avoiding the same circuit being squeezed for a long time and thus characteristics drifting, resulting in the decline of reliability.

SUMMARY OF THE INVENTION

To solve the problem mentioned above, the present invention aims to provide a liquid crystal drive circuit and a gate drive panel for avoiding the same circuit being squeezed for a long time and thus characteristics drifting.

A liquid crystal drive display device is provided according to an embodiment of the present invention. The liquid crystal drive display device includes a display area and a liquid crystal drive circuit. The liquid crystal drive circuit includes a plurality of stage GOA circuits, each stage GOA circuit includes a signal line and an auxiliary pull-down circuit. The signal lines are divided into odd-numbered signal lines and even-numbered signal lines, the auxiliary pull-down circuits are divided into first auxiliary pull-down circuits and second auxiliary pull-down circuits. The odd-numbered signal lines and the even-numbered signal lines are separately located on two sides of the display area, and the first auxiliary pull-down circuits and the second auxiliary pull-down circuits are also separately located on two sides of the display area. Any two adjacent stage GOA circuits of the plurality of stage GOA circuits share the first auxiliary pull-down circuits and the second auxiliary pull-down circuits.

Preferably, each auxiliary pull-down circuit of the first and the second auxiliary pull-down circuits comprises a first thin film transistor; a second thin film transistor, a source of the second thin film transistor being connected to a source of the first thin film transistor; a fifth thin film transistor; a sixth thin film transistor, a source of the sixth thin film transistor being connected to a drain of the fifth thin film transistor; a seventh thin film transistor, a source of the seventh thin film transistor being connected to a source of the fifth thin film transistor, and the drain of the seventh thin film transistor being connected to a gate of the first thin film transistor and a gate of the second thin film transistor; and an eighth thin film transistor, a source of the eighth thin film transistor being connected to a drain of the seventh thin film transistor.

Preferably, the GOA circuit further comprises a third thin film transistor; a fourth thin film transistor, a gate of the fourth thin film transistor being connected to a gate of the third thin film transistor; a ninth thin film transistor; a tenth thin film transistor, a gate of the tenth thin film transistor being connected to a source of the fourth thin film transistor and a drain of the ninth thin film transistor; an eleventh thin film transistor, a gate of the eleventh thin film transistor being connected to a drain of the ninth thin film transistor, and a drain of the eleventh thin film transistor being connected to a source of the third thin film transistor; and a capacitor, being connected to a source of the ninth thin film transistor and a gate of the tenth thin film transistor.

Preferably, the first auxiliary pull-down circuits and the second auxiliary pull-down circuits are respectively controlled by a first low frequency signal and a second low frequency signal.

Preferably, when the first low frequency signal is at high voltage level, the first auxiliary pull-down circuits are performing the pull-down operation, when the first low frequency signal is at low voltage level, the first auxiliary pull-down circuits are not active; when the second low frequency signal is at high voltage level, the second auxiliary pull-down circuits are performing the pull-down operation, when the second low frequency signal is at low voltage level, the second auxiliary pull-down circuits are not active.

Preferably, the first low frequency signal is the inverse of the second low frequency signal.

A gate drive panel is provided according to another embodiment of the present invention, including a liquid crystal drive circuit, the liquid crystal drive circuit includes a plurality of stage GOA circuits, each stage GOA circuit includes a signal line and an auxiliary pull-down circuit. The signal lines are divided into odd-numbered signal lines and even-numbered signal lines, the auxiliary pull-down circuits are divided into first auxiliary pull-down circuits and second auxiliary pull-down circuits. The odd-numbered signal lines and the even-numbered signal lines are separately located on two sides of the display area, and the first auxiliary pull-down circuits and the second auxiliary pull-down circuits are also separately located on two sides of the display area. Any two adjacent stage GOA circuits of the plurality of stage GOA circuits share the first auxiliary pull-down circuits and the second auxiliary pull-down circuits.

Preferably, each auxiliary pull-down circuit of the first and the second auxiliary pull-down circuits comprises a first thin film transistor; a second thin film transistor, a source of the second thin film transistor being connected to a source of the first thin film transistor; a fifth thin film transistor; a sixth thin film transistor, a source of the sixth thin film transistor being connected to a drain of the fifth thin film transistor; a seventh thin film transistor, a source of the seventh thin film transistor being connected to a source of the fifth thin film transistor, and the drain of the seventh thin film transistor being connected to a gate of the first thin film transistor and a gate of the second thin film transistor; and an eighth thin film transistor, a source of the eighth thin film transistor being connected to a drain of the seventh thin film transistor.

Preferably, the GOA circuit further comprises a third thin film transistor; a fourth thin film transistor, a gate of the fourth thin film transistor being connected to a gate of the third thin film transistor; a ninth thin film transistor; a tenth thin film transistor, a gate of the tenth thin film transistor being connected to a source of the fourth thin film transistor and a drain of the ninth thin film transistor; an eleventh thin film transistor, a gate of the eleventh thin film transistor being connected to a drain of the ninth thin film transistor, and a drain of the eleventh thin film transistor being connected to a source of the third thin film transistor; and a capacitor, being connected to a source of the ninth thin film transistor and a gate of the tenth thin film transistor.

Preferably, the first auxiliary pull-down circuits and the second auxiliary pull-down circuits are respectively controlled by a first low frequency signal and a second low frequency signal.

Preferably, when the first low frequency signal is at high voltage level, the first auxiliary pull-down circuits are performing the pull-down operation, when the first low frequency signal is at low voltage level, the first auxiliary pull-down circuits are not active; when the second low frequency signal is at high voltage level, the second auxiliary pull-down circuits are performing the pull-down operation, when the second low frequency signal is at low voltage level, the second auxiliary pull-down circuits are not active.

Preferably, the first low frequency signal is the inverse of the second low frequency signal.

The height of the wiring space of each stage GOA circuit of the present invention is bigger, the width of the wiring can be reduced, and each following stage GOA circuit only has a set of auxiliary pull-down circuits on average, the GOA circuit itself occupies a smaller space, and this is advantageous to the narrow border design.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
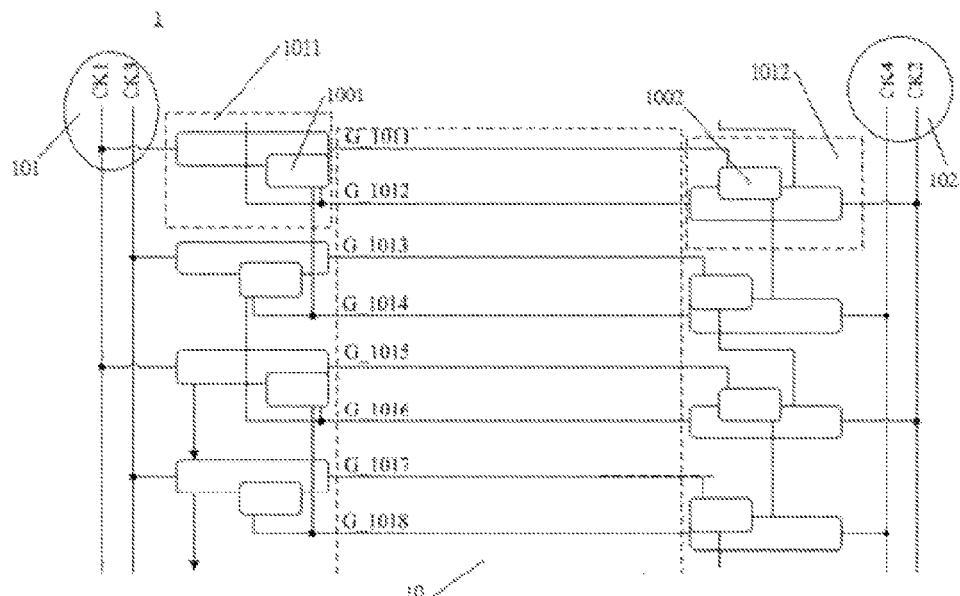
FIG. 1 is a structural diagram of the GOA of the gate drive panel of an embodiment of the present invention.

As used in this specification the term "embodiment" means that instance, an example or illustration. In addition, for the articles in this specification and the appended claims, "a" or "an" in general can be interpreted as "one or more" unless specified otherwise or clear from context to determine the singular form.

In the drawings, the same reference numerals denote units with similar structures.

The GOA structure of the gate drive panel provided according to an embodiment of the present invention is shown in FIG. 1. It can be seen in FIG. 1 that the signal lines are divided into odd-numbered-numbered signal lines 101 and even-numbered signal lines 102. They are located on two sides of the panel 1 respectively and are alternatively extended into the display area 10 of the panel 1. Two adjacent stage GOA circuits 1011 and 1012 respectively use the first auxiliary pull-down circuits 1001 and the second auxiliary pull-down circuit 1002. The first auxiliary pull-down circuit 1001 and the second auxiliary pull-down circuit 1002 are controlled by two low frequency signals LC1 and LC2, alternatively pulling down voltage applied on point Q of GOA circuits 1011 during different periods of time.

Figure 2:
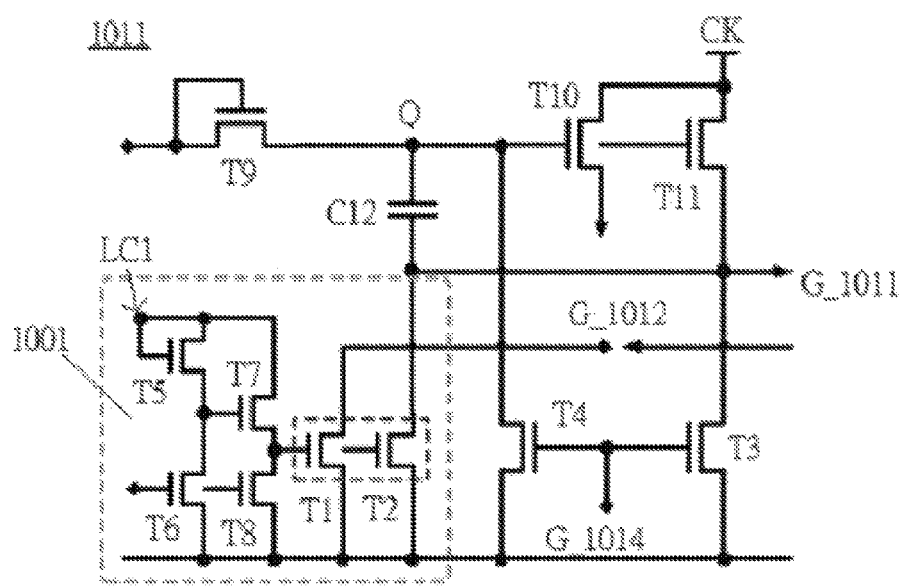
FIG. 2 is a circuit diagram of one of the GOA circuits in FIG. 1.

FIG. 2 is a circuit diagram of one of the GOA circuits in FIG. 1. GOA circuit 1011 includes a third thin film transistor T3, a fourth thin film transistor T4, a ninth thin film transistor T9, a tenth thin film transistor T10, an eleventh thin film transistor T11 and a capacitor C12. A drain of the ninth thin film transistor T9 is connected to a gate of the tenth thin film transistor T10 and a gate of the eleventh thin film transistor T11. A gate of the third thin film transistor T3 is connected to a gate of the fourth thin film transistor T4. A source of the third thin film transistor T3 and a source of the fourth thin film transistor T4 are respectively connected to a drain of the eleventh thin film transistor T11 and a gate of the tenth thin film transistor T10. Each of the first auxiliary pull-down circuits 1001 in FIG. 2 includes a first thin film transistor T1, a second thin film transistor T2, a fifth thin film transistor T5, a sixth thin film transistor T6, a seventh thin film transistor T7, an eighth thin film transistor T8. A drain of the fifth thin film transistor T5 is connected to a source of the sixth thin film transistor T6. A source of the fifth thin film transistor T5 is connected to a source of the seventh thin film transistor T7, A drain of the seventh thin film transistor T7 is connected to a source of the eighth thin film transistor T8. A gate of the seventh thin film transistor T7 is connected to the drain of the fifth thin film transistor T5. A gate of the first thin film transistor T1 is connected to a gate of the second thin film transistor T2 and the drain of the seventh thin film transistor T7. A source of the first thin film transistor T1 is connected to a source of the second thin film transistor T2. The capacitor C12 is connected to a source of the ninth thin film transistor T9 and a gate of the tenth thin film transistor T10. The first auxiliary pull-down circuits 1001 are controlled by the low frequency signal LC1. When the low frequency signal LC1 is at high voltage level, the first auxiliary pull-down circuits 1001 pulls down voltage applied on point Q of GOA circuits 1011. When the low frequency signal LC1 is at low voltage level, the first auxiliary pull-down circuits 1001 disables, then the second auxiliary pull-down circuits 1002 on the other side of the panel 1 are working correspondingly. In FIG. 2, voltage applied on point Q of GOA circuits 1011 is controlled to be pulled down by an output G_1014 of GOA circuit 1014. Outputs G_1011 and G_1012 of GOA circuits 1011 and GOA circuits 1012 are processed by two thin film transistors T1 and T2 of the first auxiliary pull-down circuits 1001, thus the auxiliary pull-down circuits 1001 are shared by GOA circuits 1011 and GOA circuits 1012.

Figure 3:
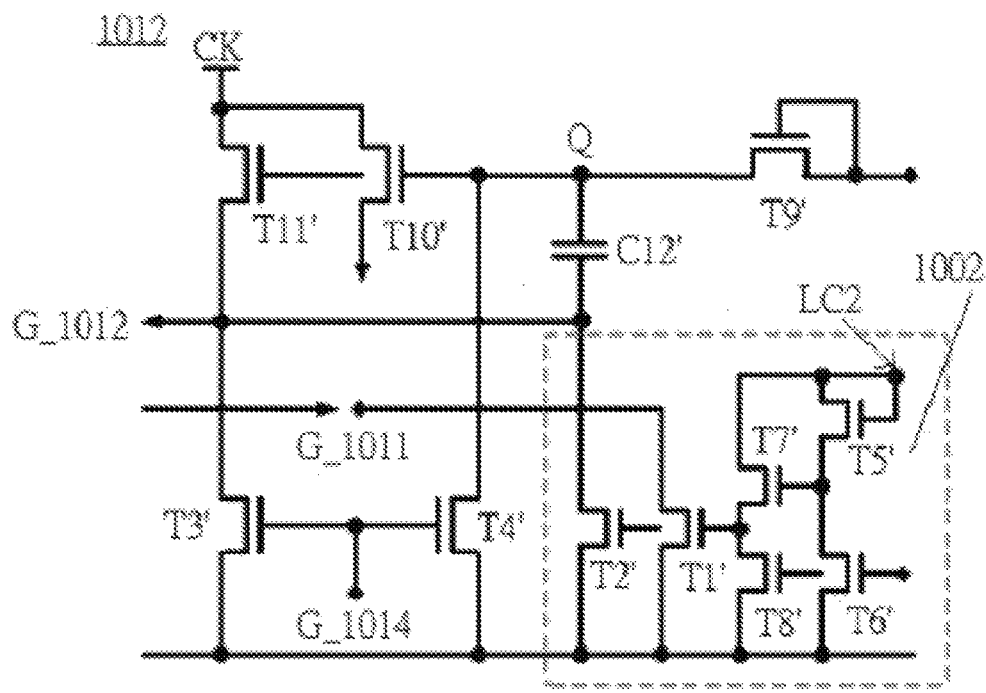
FIG. 3 is another circuit diagram of one of the GOA circuits in FIG. 1.

FIG. 3 is a circuit diagram of the GOA circuits 1012 in FIG. 1. The GOA circuit 1012 includes a third thin film transistor T3', a fourth thin film transistor T4', a ninth thin film transistor T9', a tenth thin film transistor T10', an eleventh thin film transistor T11', and a capacitor C12'. A drain of the ninth thin film transistor T9' is connected to a gate of the tenth thin film transistor T10' and a gate of the eleventh thin film transistor T11'. A gate of the third thin film transistor T3' is connected to a gate of the fourth thin film transistor T4'. A source of the third thin film transistor T3', and a source of the fourth thin film transistor T4', are respectively connected to a drain of the eleventh thin film transistor T11'. The gate of the tenth thin film transistor T10', the capacitor C12' is connected to a source of the ninth thin film transistor T9' and a gate of the tenth thin film transistor T10'. The dotted frame in FIG. 3 indicates to the first auxiliary pull-down circuit 1002, which includes a first thin film transistor T1', a second thin film transistor T2', a fifth thin film transistor T5', a sixth thin film transistor T6', a seventh thin film transistor T7', an eighth thin film transistor T8'. A drain of the fifth thin film transistor T5' is connected to a source of the sixth thin film transistor T6'. A source of the fifth thin film transistor T5' is connected to a source of the seventh thin film transistor T7'. A drain of the seventh thin film transistor T7' is connected to a source of the eighth thin film transistor T8'. A gate of the seventh thin film transistor T7' is connected to the drain of the fifth thin film transistor T5'. A gate of the first thin film transistor T1' is connected to a gate of the second thin film transistor T2' and the drain of the seventh thin film transistor T7'. A source of the first thin film transistor T1' is connected to a source of the second thin film transistor T2'. As in FIG. 2, the auxiliary pull-down circuits 1002 are controlled by the low frequency signal LC2 inversed to the low frequency signal LC1. Therefore, only one set of the circuits in FIG. 2 and FIG. 3 are used for pulling-down voltage of the gate signal at a moment, avoiding the same circuit being squeezed for a long time and thus electrical characteristics drifting. Voltage applied on the point Q' of GOA circuit 1012 is also controlled to be pulled down by an output G_1014 of GOA circuit 1014. The working auxiliary pull-down circuits 1002 can pull down the voltage applied on the point Q' of GOA circuit 1011 and GOA circuit 1012, to ensure the low voltage level state when the corresponding signal lines GL_1 and GL_2 are off.

Figure 4:
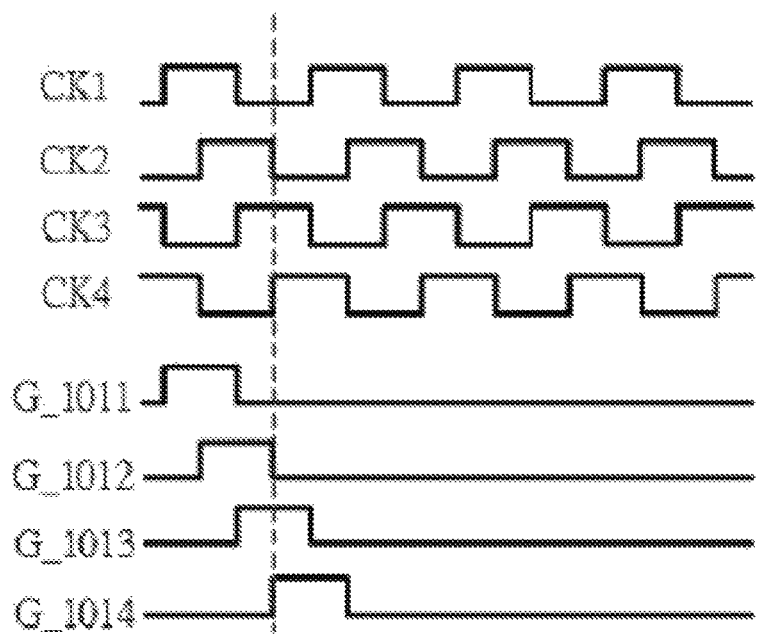
FIG. 4 is a waveform of the working GOA structure of the gate drive panel in FIG. 1.

FIG. 4 shows waveforms of signals applied on the working GOA structure of the GOA panel in FIG. 1. It can be seen from FIG. 4, for the nth stage circuit, in response to a transition of the output G_1014, the output G_1011 is already at low voltage as pulled down by the clock signal CK1, not requiring pulling down itself. For GOA circuit 1012, the thin film transistor in the auxiliary pull-down circuits 1002 is capable of pulling down the output G_1012.

Figure 5:
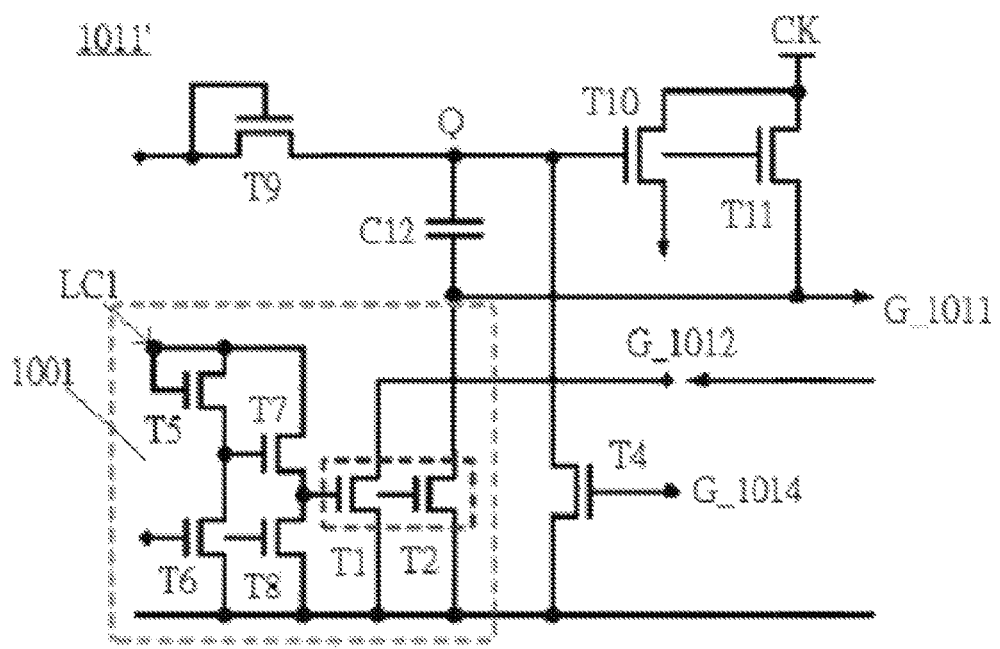
FIG. 5 is a circuit diagram of a GOA circuit of a second embodiment of the present invention.

Please refer to FIG. 5. FIG. 5 is a circuit diagram of a GOA circuit 1011' of a second embodiment of the present invention. Compared to FIG. 2, the auxiliary pull-down circuit shown in FIG. 5 does not include the third thin film transistor T3. Because the first thin film transistor T1 and the second thin film transistor T2 in the auxiliary pull-down circuit in FIG. 2 are capable of pulling down the output G_1012, so that the operation of the third thin film transistor T3 is more than needed, thus can be removed as narrower border design is required.

The width of the wiring space of each stage GOA circuit of the present invention is bigger, the width of the wiring can be reduced. Each following stage GOA circuit only has a set of auxiliary pull-down circuits on average, the GOA circuit itself occupies smaller space, and this is advantageous to the narrow border design.

In summary, although the present invention has been described in preferred embodiments above, the preferred embodiments described above are not intended to limit the invention. Persons skilled in the art can make various modifications to the present invention without departing from the scope of the invention as defined in the claims.

What is claimed is:

1. A liquid crystal drive display device, the liquid crystal drive display device comprising a display area and a liquid crystal drive circuit, the liquid crystal drive circuit comprising a plurality of stage GOA (gate-driver-on-array) circuits, each stage GOA circuit comprising a signal line and an auxiliary pull-down circuit, wherein the signal lines are divided into odd-numbered signal lines and even-numbered signal lines, the auxiliary pull-down circuits are divided into first auxiliary pull-down circuits and second auxiliary pull-down circuits;

wherein the odd-numbered signal lines and the even-numbered signal lines are separately located on two sides of the display area, and the first auxiliary pull-down circuits and the second auxiliary pull-down circuits are also separately located on two sides of the display area, any two adjacent stage GOA circuits of the plurality of stage GOA circuits share the first auxiliary pull-down circuits and the second auxiliary pull-down circuits;

when each first auxiliary pull-down circuit performs a pull-down operation, a corresponding second auxiliary pull-down circuit of the second auxiliary pull-down circuits is not active, and when each second auxiliary pull-down circuit performs a pull-down operation, a corresponding first auxiliary pull-down circuit of the first auxiliary pull-down circuit is not active;

wherein each auxiliary pull-down circuit comprises:
a first thin film transistor;
a second thin film transistor, a source of the second thin film transistor connected to a source of the first thin film transistor;
a fifth thin film transistor;
a sixth thin film transistor, a source of the sixth thin film transistor connected to a drain of the fifth thin film transistor;
a seventh thin film transistor, a source of the seventh thin film transistor connected to a source of the fifth thin film transistor, and a drain of the seventh thin film transistor connected to a gate of the first thin film transistor and a gate of the second thin film transistor; and
an eighth thin film transistor, a source of the eighth thin film transistor connected to the drain of the seventh thin film transistor; and
wherein a drain of the first thin film transistor of each first auxiliary pull-down circuit is connected to an even-numbered signal line in a same stage GOA circuit as the corresponding second auxiliary pull-down circuit, a drain of the second thin film transistor of each first auxiliary pull-down circuit is connected to and in a same stage GOA circuit as an odd-numbered signal line, a drain of the first thin film transistor of each second auxiliary pull-down circuit is connected to the odd-numbered signal line in a same stage GOA circuit as the corresponding first auxiliary pull-down circuit, and a drain of the second thin film transistor of each second auxiliary pull-down circuit is connected to and in a same stage GOA circuit as the even-numbered signal line.

2. A liquid crystal drive display device, the liquid crystal drive display device comprising a display area and a liquid crystal drive circuit, the liquid crystal drive circuit comprising a plurality of stage GOA circuits, each stage GOA circuit comprising a signal line and an auxiliary pull-down circuit, wherein the signal lines are divided into odd-numbered signal lines and even-numbered signal lines, the auxiliary pull-down circuits are divided into first auxiliary pull-down circuits and second auxiliary pull-down circuits;

wherein the odd-numbered signal lines and the even-numbered signal lines are separately located on two sides of the display area, and the first auxiliary pull-down circuits and the second auxiliary pull-down circuits are also separately located on two sides of the display area, any two adjacent stage GOA circuits of the plurality of stage GOA circuits share the first auxiliary pull-down circuits and the second auxiliary pull-down circuits;

wherein each auxiliary pull-down circuit comprises:
a first thin film transistor;
a second thin film transistor, a source of the second thin film transistor connected to a source of the first thin film transistor;
a fifth thin film transistor;
a sixth thin film transistor, a source of the sixth thin film transistor connected to a drain of the fifth thin film transistor;
a seventh thin film transistor, a source of the seventh thin film transistor connected to a source of the fifth thin film transistor, and a drain of the seventh thin film transistor connected to a gate of the first thin film transistor and a gate of the second thin film transistor; and
an eighth thin film transistor, a source of the eighth thin film transistor connected to the drain of the seventh thin film transistor.

3. The liquid crystal drive display device of claim 2, wherein the GOA circuit further comprises:
a third thin film transistor;
a fourth thin film transistor, a gate of the fourth thin film transistor connected to a gate of the third thin film transistor;
a ninth thin film transistor;
a tenth thin film transistor, a gate of the tenth thin film transistor connected to a source of the fourth thin film transistor and a drain of the ninth thin film transistor;
an eleventh thin film transistor, a gate of the eleventh thin film transistor connected to a drain of the ninth thin film transistor, and a drain of the eleventh thin film transistor connected to a source of the third thin film transistor; and
a capacitor, connected to a source of the ninth thin film transistor and a gate of the tenth thin film transistor.

4. The liquid crystal drive display device of claim 3, wherein the first auxiliary pull-down circuits and the second auxiliary pull-down circuits are respectively controlled by a first low frequency signal and a second low frequency signal.

5. The liquid crystal drive display device of claim 3, wherein when the first low frequency signal is at high voltage level, the first auxiliary pull-down circuits perform the pull-down operation, when the first low frequency signal is at low voltage level, the first auxiliary pull-down circuits are not active; when the second low frequency signal is at high voltage level, the second auxiliary pull-down circuits perform the pull-down operation, when the second low frequency signal is at low voltage level, the second auxiliary pull-down circuits are not active.

6. The liquid crystal drive display device of claim 4, wherein the first low frequency signal is the inverse of the second low frequency signal.

7. A gate drive panel, comprising a liquid crystal drive circuit, the liquid crystal drive circuit comprising a plurality of stage GOA circuits, each stage GOA circuit includes a signal line and an auxiliary pull-down circuit, wherein the signal lines are divided into odd-numbered signal lines and even-numbered signal lines, the auxiliary pull-down circuits are divided into first auxiliary pull-down circuits and second auxiliary pull-down circuits;

wherein the odd-numbered signal lines and the even-numbered signal lines are separately located on two sides of the display area, and the first auxiliary pull-down circuits and the second auxiliary pull-down circuits are also separately located on two sides of the display area, any two adjacent stage GOA circuits of the plurality of stage GOA circuits share the first auxiliary pull-down circuits and the second auxiliary pull-down circuits;

wherein each auxiliary pull-down circuit comprises:
a first thin film transistor;
a second thin film transistor, a source of the second thin film transistor connected to a source of the first thin film transistor;
a fifth thin film transistor;
a sixth thin film transistor, a source of the sixth thin film transistor connected to a drain of the fifth thin film transistor;
a seventh thin film transistor, a source of the seventh thin film transistor connected to a source of the fifth thin film transistor, and a drain of the seventh thin film transistor connected to a gate of the first thin film transistor and a gate of the second thin film transistor; and
an eighth thin film transistor, a source of the eighth thin film transistor connected to the drain of the seventh thin film transistor.

8. The gate drive panel of claim 7, wherein the GOA circuit further comprises:
a third thin film transistor;
a fourth thin film transistor, a gate of the fourth thin film transistor connected to a gate of the third thin film transistor;
a ninth thin film transistor;
a tenth thin film transistor, a gate of the tenth thin film transistor connected to a source of the fourth thin film transistor and a drain of the ninth thin film transistor;
an eleventh thin film transistor, a gate of the eleventh thin film transistor connected to a drain of the ninth thin film transistor, and a drain of the eleventh thin film transistor connected to a source of the third thin film transistor; and
a capacitor, connected to a source of the ninth thin film transistor and a gate of the tenth thin film transistor.

9. The gate drive panel of claim 8, wherein the first auxiliary pull-down circuits and the second auxiliary pull-down circuits are respectively controlled by a first low frequency signal and a second low frequency signal.

10. The gate drive panel of claim 8, wherein when the first low frequency signal is at high voltage level, the first auxiliary pull-down circuits perform the pull-down operation, when the first low frequency signal is at low voltage level, the first auxiliary pull-down circuits are not active; when the second low frequency signal is at high voltage level, the second auxiliary pull-down circuits perform the pull-down operation, when the second low frequency signal is at low voltage level, the second auxiliary pull-down circuits are not active.

11. The gate drive panel of claim 9, wherein the first low frequency signal is the inverse of the second low frequency signal.

* * * * *